United States Patent
Watanabe et al.

(10) Patent No.: US 7,576,998 B2
(45) Date of Patent: Aug. 18, 2009

(54) ELECTRONIC DEVICE

(75) Inventors: Tsutomu Watanabe, Hamamatsu (JP); Eizo Amiya, Hamamatsu (JP)

(73) Assignee: Yamaha Corporation, Hamamatsu-Shi (JP)

( * ) Notice: Subject to any disclaimer, the term of this patent is extended or adjusted under 35 U.S.C. 154(b) by 663 days.

(21) Appl. No.: 10/664,488

(22) Filed: Sep. 17, 2003

(65) Prior Publication Data
US 2005/0211646 A1 Sep. 29, 2005

(30) Foreign Application Priority Data
Sep. 18, 2002 (JP) ............................. 2002-272348

(51) Int. Cl.
H05K 7/14 (2006.01)
H05K 7/18 (2006.01)

(52) U.S. Cl. .................. 361/801; 361/756; 361/759; 361/798

(58) Field of Classification Search .......... 361/756–759, 361/807–811
See application file for complete search history.

(56) References Cited

U.S. PATENT DOCUMENTS

| 6,231,139 | B1 * | 5/2001 | Chen ....................... 312/223.2 |
| 6,529,381 | B1 * | 3/2003 | Schoenfish ................... 361/725 |
| 6,639,151 | B1 * | 10/2003 | Chen et al. ................... 174/666 |
| 6,700,791 | B1 * | 3/2004 | Zappacosta .................. 361/759 |

* cited by examiner

*Primary Examiner*—Tuan T Dinh
(74) *Attorney, Agent, or Firm*—Morrison & Foerster LLP (57) ABSTRACT

A mountain-shaped angle member 20 is fixed to a side face 12 having a stepped portion of a mixer being an electronic device. The stepped portion is composed of a first wall portion projecting outward from the side face, a second wall portion recessed inward from the first wall portion, and a connecting portion connecting the first wall portion and second wall portion. Then, a fixing member is made capable of fixing the mountain-shaped angle member in either a first attachment mode in which the angle member is in contact with the first wall portion and opposed to the connecting portion or a second attachment mode in which the angle member is in contact with the first wall portion and overhangs outward the first wall portion.

7 Claims, 5 Drawing Sheets

ELECTRONIC DEVICE

BACKGROUND OF THE INVENTION

1. Field of the Invention

The present invention relates to an electronic device which can be carried to an arbitrary place and used mounted on a rack or put on a table in accordance with setting conditions different for each place.

2. Description of the Related Art

Conventionally, when a plurality of electronic devices are connected to one another through wiring or simultaneously used, those electronic devices are typically mounted on a rack (a structure for accommodating the devices such as a shelf, support, or the like) to reduce setting space or improve working efficiency. Further, it is also performed to install the most of complicated wiring among the electronic devices on the rear side of the rack which is not seen from the front side so as to improve the appearance and safety at the working site.

Hence, most of electronic devices, which are used not being moved but mounted on a rack at a fixed place for a long time like audio devices, have panels for performing operation and display provided on their front surfaces of the electronic device main bodies (hereafter referred simply to as "main bodies"), and input/output terminals provided on the rear surfaces of the main bodies so that a user can easily operate them.

Some of the electronic devices, however, are carried to arbitrary places and used mounted on a rack (hereafter referred to as "rack-mount") or individually put on a table (hereafter referred to as "stand-alone") in accordance with setting conditions (the installation area, the kind and number of electronic devices in use, and so on) different for each place. For example, one of them is a mixer that is an audio electronic device for acoustics.

The mixer represents an electronic device for acoustic control in theaters, halls, outdoors, and so on, or for mixing and controlling a plurality of audio signals used for creating sound in recording and so on, and can mix audio signals inputted from a plurality of channels at an arbitrary level loudness (volume) ratio and output them. Typically, the mixer is also equipped with effect circuits such as equalizers, effectors, and so on for processing timbre (tone color) of audio signals, and input/output terminals. Note that various kinds of controls (knobs) for controlling the loudness or timbre are mounted on almost the entire surface of the panel provided on the upper surface of the main body.

The provision of the panel for operation and display on the upper surface of the main body brings the user to easily operate the electronic device when using it stand-alone.

However, when such an electronic device is rack-mounted, there has been a problem that when the electronic device is mounted with its panel facing upward similarly to that in stand-alone, a user is difficult to reach the back of the panel, resulting in reduced working efficiency.

Hence, it is conceivable that the main body is rotated 90° toward the front of the rack so that the panel is mounted on the rack to face the operator. However, when the shape of the main body is not a cube or rectangular solid, and especially when an electronic device is in an almost dustpan shape, as is a mixer, having a height dimension smaller than longitudinal and lateral dimensions and the height dimension is gradually reduced from the rear side to the front side, there has been a problem that the device lacks in stability to easily fall down.

Therefore, it is conceivable that a special supporter is provided on a rack to support an electronic device. However, this requires complicated-shaped supporters different for each electronic device, leading to increased cost.

Alternatively, it is also conceivable to provide an attachment portion for rack mount on an electronic device. This arrangement, however, causes a problem that the attachment portion interferes with operation during use of the electronic device stand-alone.

It is also conceivable to make the attachment portion detachable to prevent it from interfering with operation during use in stand-alone. In this case, however, the plurality of kinds of supporters different for electronic devices need to be stored other than when the electronic device is rack-mounted, and there has been a problem that labor for management and storage space are required.

Further, there has been another problem that when the electronic device is carried to an arbitrary place and used rack-mounted or stand-alone as described above, the electronic device is easily broken during carriage or setting. Further, there has been a problem that when the main body is heavy such as a mixer, an electronic device is difficult to lift up in rack mounting.

SUMMARY OF THE INVENTION

The present invention is made to solve these problems, and its purpose is to realize a structure of an electronic device ready for both of stand-alone and rack-mounted setting states without increasing cost, prevent a decrease in working efficiency and an increase in complexity of management in both of the setting states, and configure the electronic device which is hard to break and easy to lift up while it is carried and set.

To achieve the above purpose, the invention is an electronic device with a side face having a stepped portion to which a mountain-shaped angle member is fixable, the stepped portion comprising a first wall portion projecting outward from the side face, a second wall portion recessed inward from the first wall portion, and a connecting portion connecting the second wall portion and first wall portion, and the electronic device includes a fixing member for detachably fixing the angle member to the first wall portion.

The fixing member is a member capable of fixing the angle member in either a first attachment mode in which the angle member is in contact with the first wall portion and opposed to the connecting portion or a second attachment mode in which the angle member is in contact with the first wall portion and overhangs outward the first wall portion.

The angle member functions as a member for protecting the side face when it is fixed to the main body by a fixing member such that its inner angled surface is opposed to the side face, and functions as a member for mounting the main body on a rack when it is fixed to the main body by the fixing member such that its outer angled surface is opposed to the side face.

Further, both end portions of the angle member in the longitudinal direction have different shapes respectively; and the angle member is fixable in one manner to the side face to coincide with a shape of the side face when it is fixed by the fixing member such that its inner angled surface is opposed to the side face, and is fixable in two manners to the side face when it is fixed by the fixing member such that its outer angled surface is opposed to the side face.

Alternatively, the invention may be an electronic device comprising a main body having a side face, an angle member to be fixed to the side face, and a fixing member for fixing the angle member to the side face of the main body.

In this case, the angle member comprises a first plate and a second plate joined with each other at a bent portion, and in a cross section perpendicular to an longitudinal direction thereof, a distance from an outer end portion of the first plate to the bent portion is preferably longer than a distance from an outer end portion of the second plate to the bent portion.

Further, it is preferable that the first plate is provided with a first fixing portion for fixing to the side face, that the second plate is provided with a second fixing portion for fixing to the side face, and that a distance from the outer end portion of the first plate to the first fixing portion is equal to a distance from the bent portion to the second fixing portion of the second plate.

In this case, the side face has a third fixing portion for fixing to the first fixing portion or second fixing portion provided in the angle member.

All of the first, second, and third fixing portions may be holes into which a penetrating member penetrates.

Alternatively, it is also adoptable that the third fixing portion is a penetrating member, and that the first and second fixing portions are holes into which the penetrating member penetrates.

Alternatively, it is also adoptable that the first and second fixing portions are penetrating members, and that the third fixing portion is a hole into which the penetrating member penetrates.

The above and other objects, features and advantages of the invention will be apparent from the following detailed description which is to be read in conjunction with the accompanying drawings.

DETAILED DESCRIPTION OF THE PREFERRED EMBODIMENTS

Hereinafter, preferred embodiments of the invention will be described with the drawings.

Figure 1:
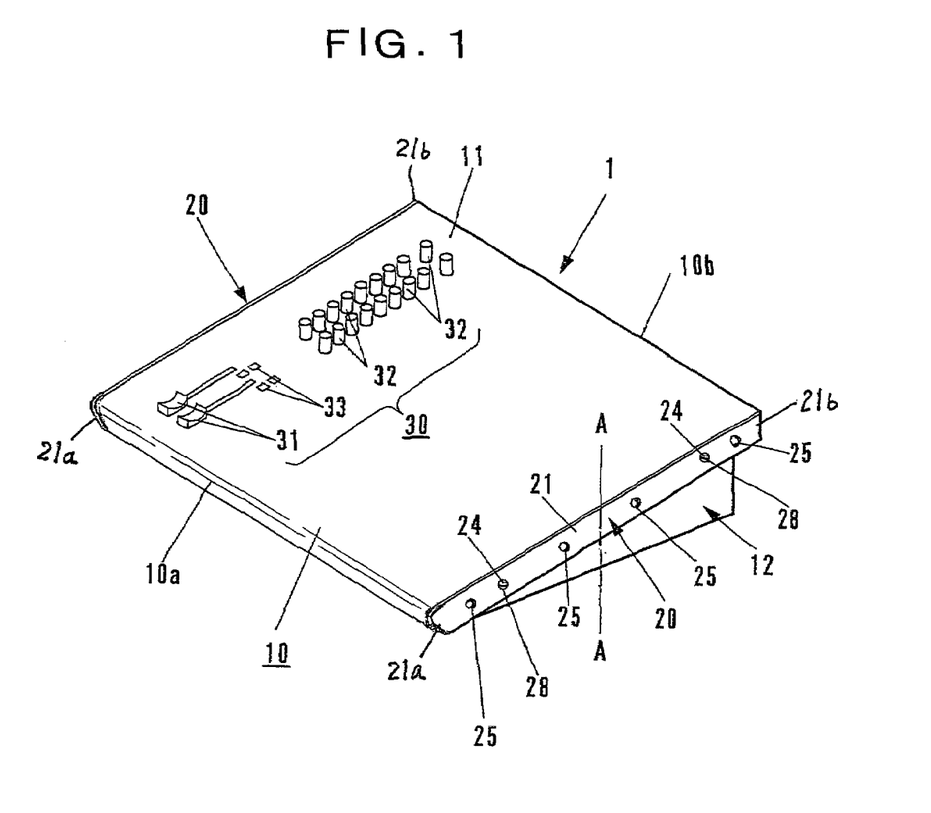
FIG. 1 is a perspective view showing a mixer being an embodiment of an electronic device according to the invention in a state in which angle members are attached thereto in a first attachment mode.
Figure 2:
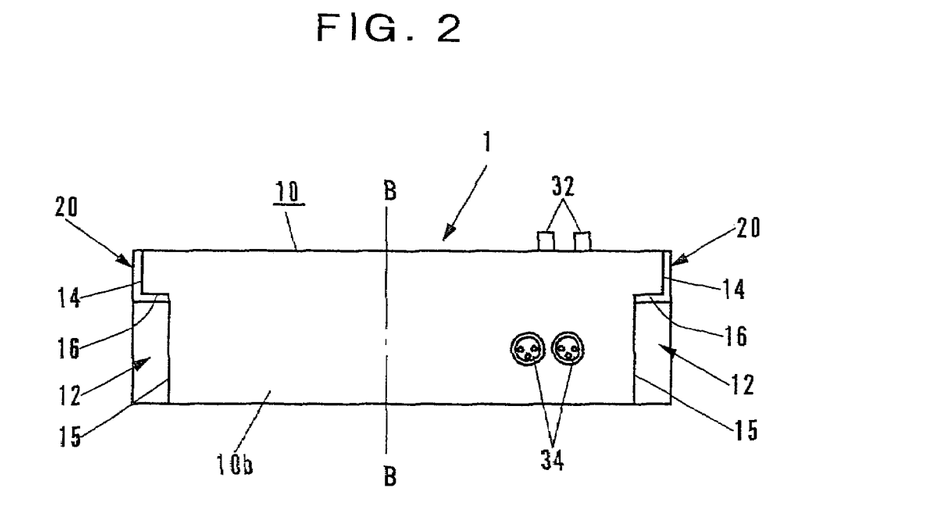
FIG. 2 is a rear view of the same.

A perspective view of a mixer being an embodiment of an electronic device according to the invention is shown in FIG. 1, and a rear view thereof is shown in FIG. 2.

A mixer 1 of this embodiment is composed of a main body 10 provided with stepped portions on its both right and left side faces 12, and a pair of mountain-shaped angle members 20 attached to both the side faces 12.

First, the main body 10 is described. The main body 10 has, as shown in FIG. 2, an almost dustpan shape made up with both the right and left side faces 12, a front surface 10a and a rear surface 10b which are front and rear side faces, and a bottom surface, and is provided with a panel 11 at its upper surface. Further, the front surface 10a is lower than the rear surface 10b, so that the panel 11 forms a slope inclined downward toward the front surface 10a. On almost the entire surface of the panel 11, many controls 30 such as slide volume knobs 31, rotary volume knobs 32, switch buttons 33, and so on are provided together with many not-shown indicators. The controls 30, however, are not specific to the invention, and therefore only two rows thereof are illustrated on the left end of the panel 11, and the illustrations of others are omitted to eliminate complexity of the drawing.

Further, as shown in FIG. 2, many input/output terminals 34 and so on are provided on the rear surface 10b of the main body 10. The input/output terminals 34 are not specific to the invention like the controls 30, and therefore only some of them are shown, and the illustrations of others are omitted.

Then, the main body 10 inputs/outputs a plurality of audio signals from/to the plurality of input/output terminals 34 (on the input side) connected to musical instruments, microphones, and the like which are not shown. Then, after modifying or mixing their loudness and timbre in accordance with operation of the plurality of controls 30 by an operator, the main body 10 outputs them to amplifiers, speakers, and headphones or recording devices connected to the input/output terminals 34 (on the output side) different from the aforementioned ones.

On the other hand, both the right and left side faces 12 of the main body 10 are respectively provided with stepped portions composed of first wall portions 14 projecting outward, second wall portions 15 recessed inward from the first wall portions 14, and connecting portions 16 connecting the first wall portions 14 and second wall portions 15. An angle member 20 which will be described later is fixed to the first wall portion 14 of each of the stepped portions.

Incidentally, the stepped portions on both the side faces 12 are formed to be bilaterally symmetrical about a centerline B-B in the lateral width direction of the main body 10 shown in FIG. 2.

Figure 3:
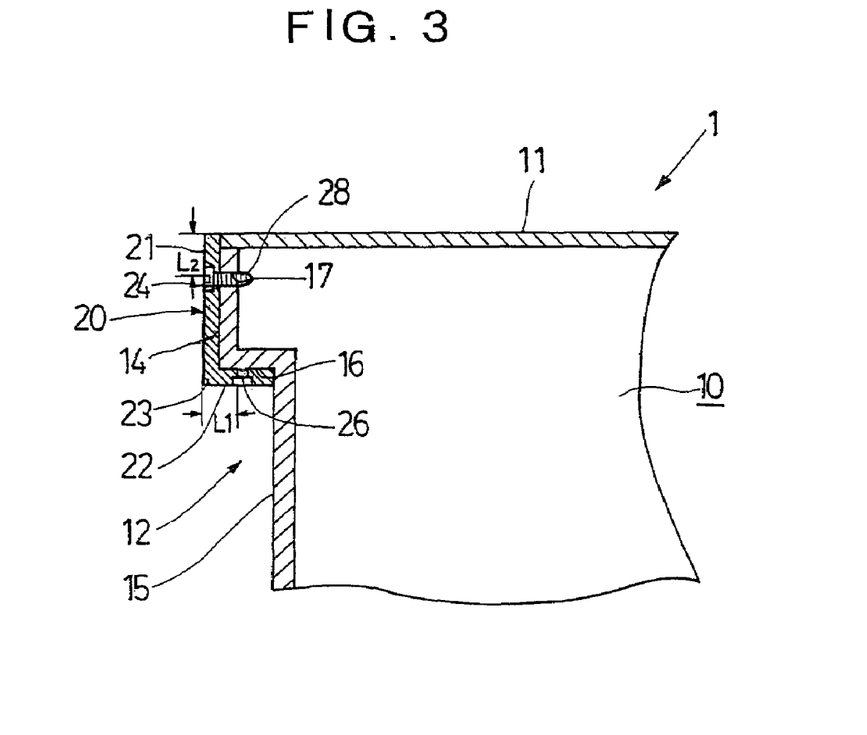
FIG. 3 is an end view of an enlarged transverse cross section of a fixing portion of the angle member to a first wall portion in the first attachment mode.

FIG. 3 is an end view of an enlarged transverse cross section of a fixing portion of the angle member to the first wall portion.

The angle members 20 of this mixer 1 are fixed to the first wall portions 14 in directions to be in contact with the first wall portions 14 and connecting portions 16 of the stepped portions on both the side faces of the main body 10. It should be noted that the angle member 20 and connecting portion 16 are not necessarily in contact with each other but may be just opposed to each other. The fixation of the angle member 20 to the first wall portion 14 of the stepped portion in such a direction is called a "first attachment mode." FIG. 3, FIG. 1 and FIG. 2 show a state in which a pair of angle members 20 are attached to the stepped portions on both the side faces 12 of the mixer 1 in this first attachment mode. The angle member 20 will be described later in detail.

In this embodiment, the first wall portions 14 and connecting portions 16 which form the stepped portions on both the side faces 12, and the first wall portions 14 and upper surface of the panel 11 make almost right angles respectively.

In the first wall portion 14, a plurality of (two in the case of this mixer 1) screw holes 17, forming pairs, are provided at positions symmetrical about the center in the longitudinal direction of the first wall portion 14 so as to detachably fix the angle member 20.

Next, the angle member 20 is described. This angle member 20 is a member, made of a long metal plate or the like, in a mountain shape (having a L-shaped transverse cross section in this case) bent at an almost right angle at a bent portion 23 parallel to its longitudinal direction.

Hereinafter, one (in contact with the first wall portion 14 in the first attachment mode) of two long plate portions perpendicular to each other at the bent portion 23 of the angle member 20 is called a first plate 21, and the other (in contact with the connecting portion 16 in the first attachment mode) is called a second plate 22. The bent portion 23 of the angle portion 20 includes not only a bent portion formed by a press bending process of a flat plate member but also a bent portion formed by a process of melting to solidification of aluminum or the like by extrusion molding.

The outer shape of the first plate 21 is almost the same as the outer shape of the first wall portion 14 of the stepped portion, and the outer shape of the second plate 22 is almost the same as the outer shape of the connecting portion 16.

Therefore, as shown in FIG. 1, an end portion 21a of the first plate 21 on the front surface side in the longitudinal direction is in the shape of a projection having an arc, and an end portion 21b on the rear surface side is flat. Accordingly, the shape of the mountain-shaped angle member 20 is asymmetrical about a centerline A-A in the longitudinal direction such that both end portions thereof in the longitudinal direction have different shapes.

Further, in the first plate 21 of the angle member 20, a plurality of (four in the case of this mixer 1) attachment holes 25, which are used when the mixer 1 is mounted on a later-described rack (rack mounted), are provided at positions symmetrical about the centerline A-A in the longitudinal direction.

Further, in the first plate 21, a plurality of (two in the case of this mixer 1) attachment holes 24 for detachably fixing the angle member 20 to the first wall portion 14 of the stepped potion are provided. The attachment holes 24 are through holes provided with steps coinciding with the shape of head portions of attaching screws 28 as shown in FIG. 3, and provided at positions symmetrical about the centerline A-A in the longitudinal direction of the first plate 21 at the same intervals as those of the two screw holes 17 provided in the first wall portion 14. Accordingly, the positions of the attachment holes 24 are also symmetrical about the center in the longitudinal direction of the first wall portion 14 of the stepped portion.

Note that the right and left angle members 20 are in the shape symmetrical about the centerline B-B of the main body 10 shown in FIG. 2.

Then, as shown in FIG. 3, the two attaching screws 28 are inserted into the attachment holes 24 in the first plate 21 from outside the angle member 20 respectively, and screwed into and fastened to the screw holes 17 provided in the first wall portion 14 respectively, so that the angle member 20 can be bilaterally symmetrically fixed, in the first attachment mode, to the first wall portion 14 of the stepped portion on the side face 12 of the main body 10. By loosening and pulling out the attaching screws 28, the angle member 20 is also easily detached.

It should be noted that in the second plate 22, a plurality of (two in the case of this mixer 1) attachment holes 26 for detachably fixing the angle member 20 to the stepped portion are provided. The attachment holes 26 are also through holes having the same shape as that of the attachment hole 24 in the first plate 21, and provided at positions symmetrical about the center in the longitudinal direction of the second plate 22 at the same intervals as those of the screw holes 17 in the first wall portion 14. In the first attachment mode, however, the attaching screws 28 are not inserted into the attachment holes 26, which are vacant.

In this embodiment, the attachment holes 24 and 26 in the angle member 20, screw holes 17 in the first wall portion 14, and attaching screws 28 constitute a fixing member which detachably fixes the angle member 20 to the first wall portion 14.

As described above, the outer shape of the angle member 20 is almost the same as the outer shape of the first wall portion 14 and connecting portion 16 so that the angle member 20 never overhangs out from the main body 10 in the first attachment mode. Further, the one pair of angle members 20 serve as protectors covering the first wall portions 14 and connecting portions 16 which are projecting portions, fragile in particular, of the stepped portions on both the side faces 12 of the mixer 1 so as to be able to prevent breakage of the mixer 1 while it is carried ant set.

As described above, in the first attachment mode, the angle member 20 is fixed by the fixing member such that its inner angled surface being the inner side face of its mountain shape is opposed to the side face 12 being the side face of the main body 10. In this case, the angle member 20 can be fixed in one manner to the side face to coincide with the shape of the side face.

In addition, the angle members 20 never interfere with operation while the mixer 1 is not mounted on a rack but individually set on a table and used in stand-alone.

However, as described above, the second plate 22 of the angle member 20 also includes the attachment holes 26 for detachably fixing to the first wall portion 14 of the stepped portion.

Hence, the right and left angle members 20 attached in the first attachment mode shown in FIG. 2 are detached from the stepped portions by pulling out the attaching screws 28 and rotated 180° with the centerlines A-A in the longitudinal directions as axes respectively so that the front and rear sides are reversed, and are rotated 90° with the bent portions 23 as axes, whereby the angle members 20 can be fixed such that the second plates 22 are in contact with the first wall portions 14, and the first plates 21 overhang outward the first wall portions 14. Alternatively, it is adoptable that the right and left angle members 20 are rotated 180° around axial lines perpendicular to the surface of the first plates 21 so that their front and rear sides, and upper and lower sides are reversed, and the right and left angle members 20 are exchanged with each other and attached.

The fixation of the angle member 20 to the first wall portion 14 of the stepped portion in such a direction is called a "second attachment mode."

Figure 5:
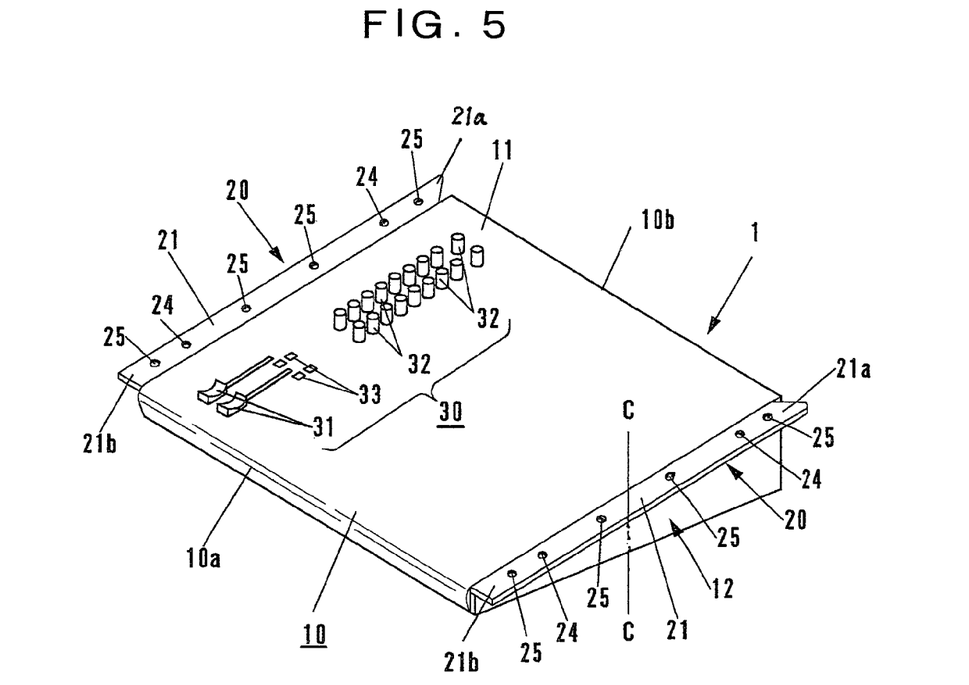
FIG. 5 a perspective view showing the same mixer as that in FIG. 1 in a state in which the angle members are attached thereto in the second attachment mode.

FIG. 5 shows the external appearance of the mixer in a state in which a pair of angle members 20 which are attached to the stepped portions on both the side faces 12 in the second attachment mode.

Figure 4:
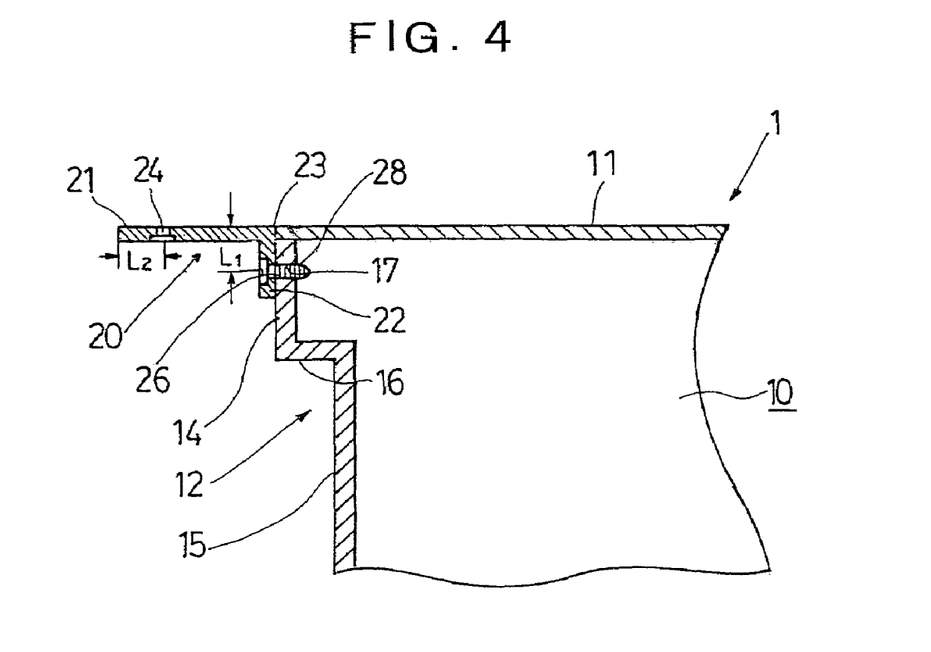
FIG. 4 is an end view of an enlarged transverse cross section of the fixing portion of the angle member to the first wall portion in a second attachment mode.

FIG. 4 is an end view of an enlarged transverse cross section, in the second attachment mode, of the same portion as in FIG. 3.

In the second attachment mode, the second plate 22 of the angle member 20 is in contact with the first wall portion 14, and the first plate 21 overhangs outward the side face 12 of the main body 10 from the first wall portion 14. Note that it is necessary to fix the second plate 22 to an upper portion of the first wall portion 14 in order to bring the first plate 21 flush with the panel 11 of the main body 10.

Therefore, the attachment holes 26 in the second plate 22 are preferably provided at positions where they are opposed to the two screw holes 17 provided in the first wall portion 14 respectively when the second plate 22 is brought into contact with the first wall portion 14 such that the first plate 21 is flush with the panel 11.

In other words, it is preferable to set, in the cross section perpendicular to the longitudinal direction of the angle member 20, the distance (L1) from the bent portion 23 to the attachment hole 26 in the second plate 22 equal to the distance (L2) from the outer end portion of the first plate 21 to the attachment hole 24.

Then, as in the first attachment mode, the two attaching screws 28 are inserted into the attachment holes 26 in the second plate 22 from outside the angle member 20 respectively, and screwed into and fastened to the screw holes 17 provided in the first wall portion 14 respectively in such a manner that the head portions of the attaching screws 28 fit with the steps of the attachment holes 26, so that the angle members 20 can be fixed, in the second attachment mode, to the first wall portions 14 of the stepped portions on both the side faces 12 of the main body 10 and also easily detached therefrom.

Further, in the attachment state shown in FIG. 5, both the right and left angle members 20 are attached in directions such that the projection-shaped end portions 21a of the first plates 21 slightly project from the rear surface 10b of the main body 10.

Figure 6:
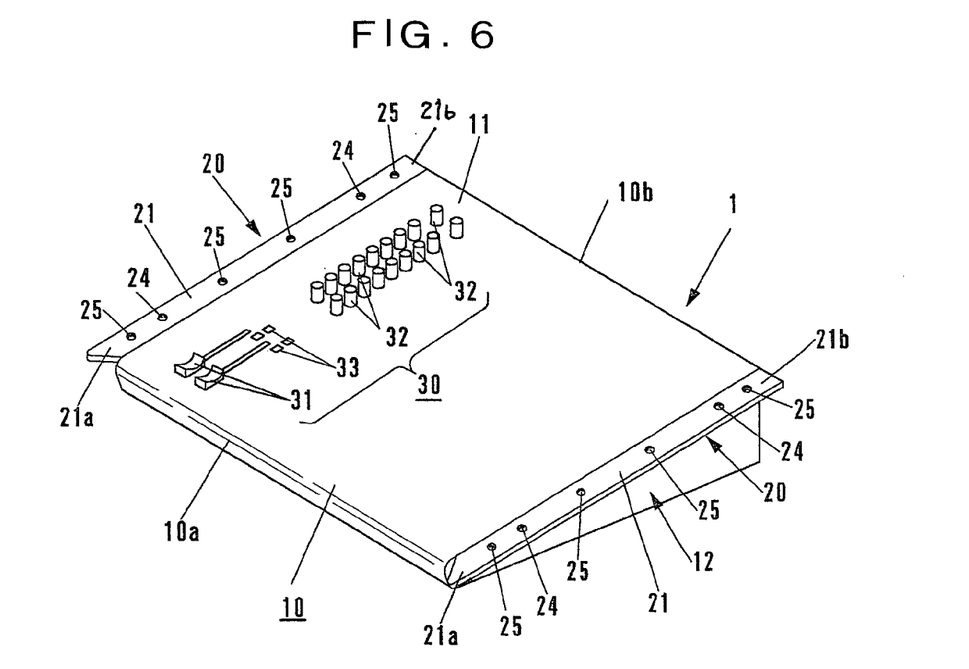
FIG. 6 is a perspective view showing the same in a state in which the angle members are attached in the second attachment mode in which the front and rear sides are reversed to those in FIG. 5.

The attachment state shown in FIG. 5 is turned into the attachment state shown in FIG. 6 by detaching the right and left angle members 20, rotating them by 180° with centerlines C-C in the longitudinal directions as axes to reverse their front and rear sides, exchanging the right and left angle members 20 with each other, and fixing the angle members 20 to the first wall portions 14 of the stepped portions on both the side faces 12 of the main body 10. This state is also in the second attachment mode, but both of the right and left angle members 20 are attached in the directions such that the projection-shaped end portions 21a of the first plates 21 slightly project from the front surface 10a of the main body 10.

As described above, in the second attachment mode, the right and left angle members 20 can be attached in two manners to the first wall portions 14 being the side faces of the main body 10.

In these states in the second attachment mode, the first plates 21 of the angle members 20 overhang outward from both the right and left side faces of the main body 10, resulting in the mixer 1 in a T-shaped structure. Therefore, while a large and heavy mixer 1 is carried and set, the mixer can be easily lifted up by grasping the pair of first plates 21. Further, this structure facilitates mounting the mixer 1 on a rack as described later.

Next, another embodiment of the invention is described with reference to FIG. 7 to FIG. 12. Note that, in these drawings, portions corresponding to those in FIG. 1 to FIG. 6 are assigned the same numbers, so that they are described only in different points with the descriptions on common points omitted.

Figure 7:
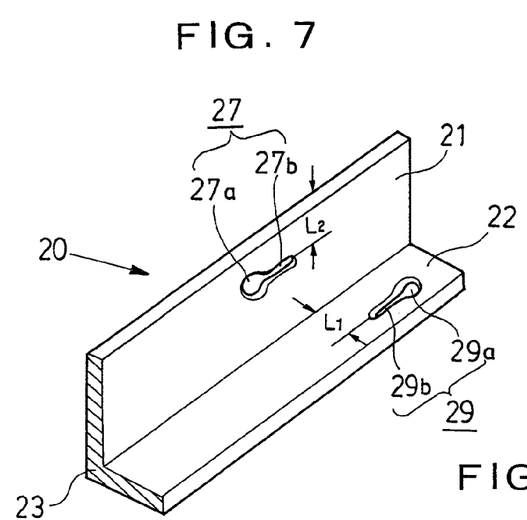
FIG. 7 is an enlarged perspective view of a portion of an angle member used in another embodiment of the invention.

In an electronic device of this embodiment, as shown in FIG. 7, a hole 27 is provided in a first plate 21 of an angle member 20 as a first fixing portion, and a hole 29 is provided also in a second plate 22 as a second fixing portion. The hole 27 in the first plate 21 is in the shape of a key hole composed of a round hole portion 27a and a long hole portion 27b which extends therefrom along the longitudinal direction of the first plate 21. The hole 29 in the second plate 22 is also in the shape of a key hole composed of a round hole portion 29a and a long hole portion 29b which extends therefrom along the longitudinal direction of the second plate 22. In this example, the long hole portion 27b of the hole 27 in the first plate 21 and long hole portion 29b of the hole 29 in the second plate 22 extend in directions opposite to each other.

Figure 9:
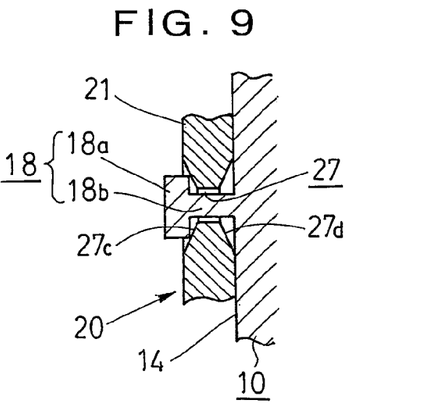
FIG. 9 is an enlarged cross-sectional view of a principal portion showing a fitting state between the penetrating member and a hole in a first plate in the same embodiment.

Around the round hole portions 27a and 29a and the long hole portions 27b and 29b of the holes 27 and 29, tapered portions are formed on both surfaces of the first plate 21 and second plate 22 respectively. FIG. 9 shows tapered portions 27c and 27d around the hole 27 in the first plate 21.

Figure 8:
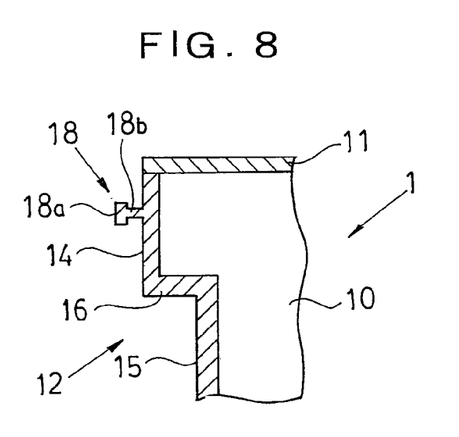
FIG. 8 is a cross-sectional view of a principal portion showing a portion including and near a first wall portion provided with a penetrating member of a mixer main body in the same embodiment.

On the other hand, as shown in FIG. 8, a penetrating member 18, in place of the screw hole 17 in the above-described embodiment, is provided in a projecting manner on a first wall portion 14 which constitutes a side face 12 of a main body 10 of a mixer 1 being an electronic device. The penetrating member 18 is a hook-shaped projection composed of a disc-shaped head portion 18a and a cylindrical column portion 18b having a diameter smaller than that of the head portion 18a. The outer diameter of the head portion 18a of the penetrating member 18 is slightly smaller than the inner diameters of the round hole portions 27a and 29a of the hole 27 and 29, and the outer diameter of the cylindrical column portion 18b is slightly smaller than the widths of the long hole portions 27b and 29b of the holes 27 and 29.

Then, when the angle member 20 is fixed to the first wall portion 14 of the main body 10, in the case of the first attachment mode, the inner surface of the first plate 21 is put along the first wall portion 14, the penetrating member 18 is inserted into the round hole portion 27a of the hole 27 from the head portion 18a, and the angle member 20 is slid in the longitudinal direction. Thereby, as shown in FIG. 9, the cylindrical column portion 18b of the penetrating member 18 fits with the long hole portion 27b, and the head portion 18a is engaged with the tapered portion 27c therearound, whereby the angle member 20 is securely fixed to the first wall portion 14 (the side face 12 of the main body 10) since the tapered portion 27c is formed to make the fitting more secure toward the tip of the long hole portion 27b.

In the case of the second attachment mode, the outer surface of the second plate 22 is put along the first wall portion 14, the penetrating member 18 is inserted into the round hole portion 29a of the hole 29, and the angle member 20 is slid in the longitudinal direction, whereby the angle member 20 can be securely fixed as above to the first wall portion 14 (the side face 12 of the main body 10).

Figure 10:
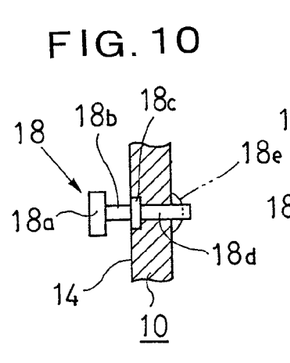
FIG. 10 is a cross-sectional view of a principal portion for explaining a method of providing the penetrating member in the first wall portion.

There are various methods to provide the penetrating member 18 on the first wall portion 14 of the main body 10. For example, as shown in FIG. 10, a flange portion 18c and an extending portion 18d are integrally provided on the base of the cylindrical column portion 18b of the penetrating member 18, the extending portion 18d is inserted into a through hole provided in the first wall portion 14 to allow its tip portion to project to the rear surface side of the first wall portion 14, the flange portion 18c is allowed to fit with a recessed portion on the front side of the first wall portion 14, and a portion of the extending portion 18d projecting to the rear side of the first wall portion 14 is pressed with high pressure or nipped with pressure to be crushed and caulked as shown by an imaginary line.

Figure 11:
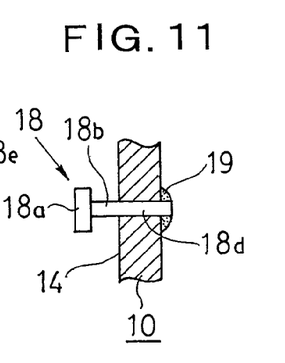
FIG. 11 is a cross-sectional view of a principal portion for explaining another method of providing the penetrating member in the first wall portion.

Alternatively, as shown in FIG. 11, an extending portion 18d made by just extending the cylindrical column portion 18b of the penetrating member 18 is inserted into the through hole provided in the first wall portion 14 to allow its tip portion to project to the rear side of the first wall portion 14, and the projecting portion and the first wall portion 14 are welded with a welding material 19. Further, it is also adoptable to fix the penetrating member 18 by forming the outer periphery of its extending portion 18d into a tapered shape having a slight taper, and inserting it with pressure into the through hole provided in the first wall portion 14.

Figure 12:
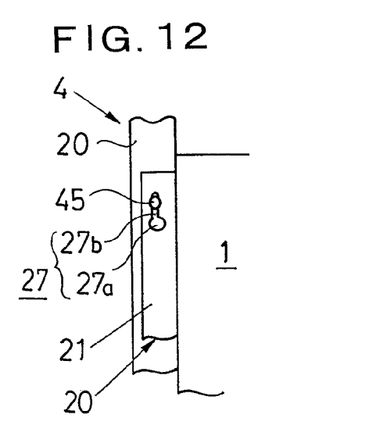
FIG. 12 is a partial front view used for explanation when a mixer to which the angle member according to this embodiment is fixed in the second attachment mode is mounted on a rack.

When the angle member 20 is fixed to the first wall portion 14 of the main body 10 in the second attachment mode, the hole 27 in the first plate 21 is used also to fix the mixer 1 being an electronic device to a later-described rack 4. In this case, as shown in FIG. 12 it is only required to provide a penetrating member 45, which is similar to the penetrating member 18, on the front surface of the angle member 20 being a support on the rack 4, insert the penetrating member 45 into the hole 27 in the first plate 21, and slide it downward.

In this case, by forming the long hole portion 27b of the hole 27 in the first plate 21 on the upper side of the round hole portion 27a, the first plate 21 slides downward due to the self weight of the mixer 1 to make the fitting between the penetrating member 45 and hole 27 more secure, resulting in secure fixation with no looseness afterwards.

Further, it is also adoptable to provide, conversely to the above-described embodiment, projecting penetrating members as a first fixing portion at least on the inner surface side of the first plate 21 of the angle member 20 and as a second fixing member on the outer surface side of the second plate 22 respectively, and provide, as a third fixing portion, a hole similar to the holes 27 and 29 shown in FIG. 7 in the first wall portion 14 of the main body 10.

It should be noted that in the embodiment described with FIG. 1 to FIG. 6 the attachment hole 24 provided in the first plate 21 of the angle member 20 is the first fixing portion, the attachment hole 26 provided in the second plate 22 is the second fixing portion, and the screw hole 17 provided in the first wall portion 14 of the main body 10 is the third fixing portion. Further, the attaching screw 28 is the penetrating member penetrating the holes 17, 24, and 26.

Figure 13:
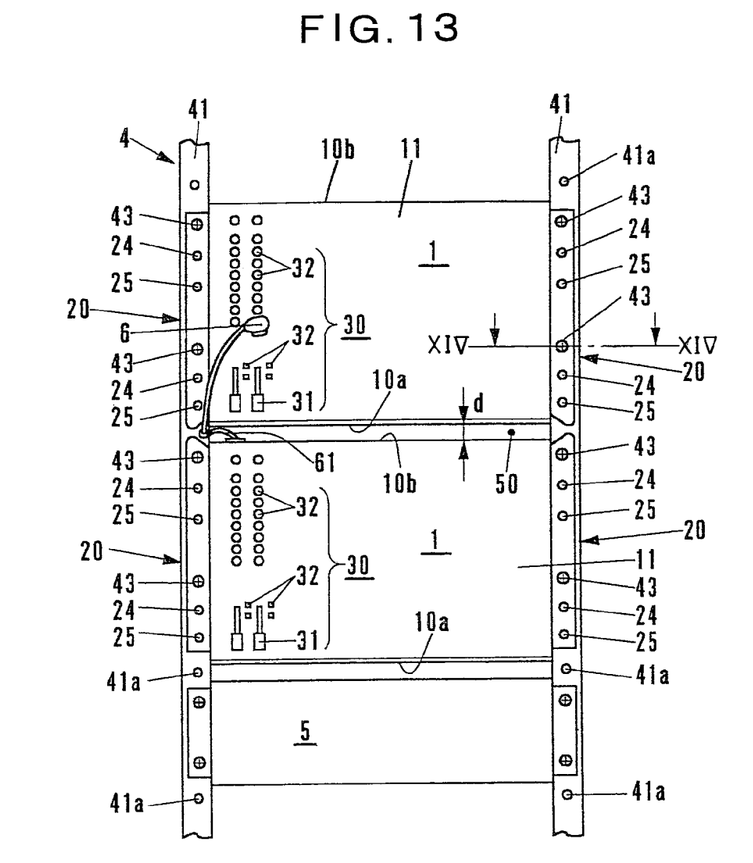
FIG. 13 is a front view showing the mixers shown in FIG. 5 and FIG. 6 in a state in which they are mounted on a rack.

FIG. 13 is a front view showing a rack-mount example in which this mixer is mounted on a rack. In this example, two mixers 1 with the angle members 20 attached thereto in the second attachment mode are mounted on a rack 4 together with a sound source unit 5 and an external lighting fixture 6. It should be noted that the sound source unit 5 is an audio electronic device that is used as a sound source, for which a well-known one may be arbitrarily used, and which is not specific to the invention, and therefore the description thereof is omitted.

The rack 4, which is a conventional typical rack, is composed of vertical and horizontal angle members including a pair of attachment supports 41. The attachment support 41 is provided with many attachment holes 41a for attaching an electronic device at regular intervals in the vertical direction.

On the other hand, the two mixers 1 are attached with their panels 11 facing forward (the front) of the rack 4 such that the front surfaces 10a of the main bodies 10 are at the lower side and the rear surfaces 10b are at the upper side respectively. Further, the first plates 21 of the angle members 20 are overlaid on the front surfaces of the attachment supports 41 as seen from the front side of the rack 4. In other words, the rear surfaces of the first plates 21 are in contact with the front surfaces of the attachment supports 41.

In this event, the position (height) of the mixer 1 is adjusted such that at least two among the plurality of attachment holes 25 for rack-mount provided in each of the first plates 21 of the angle members 20 are aligned with some of many attachment holes 41a for attachment of an electronic device provided in the attachment support 41.

Figure 14:
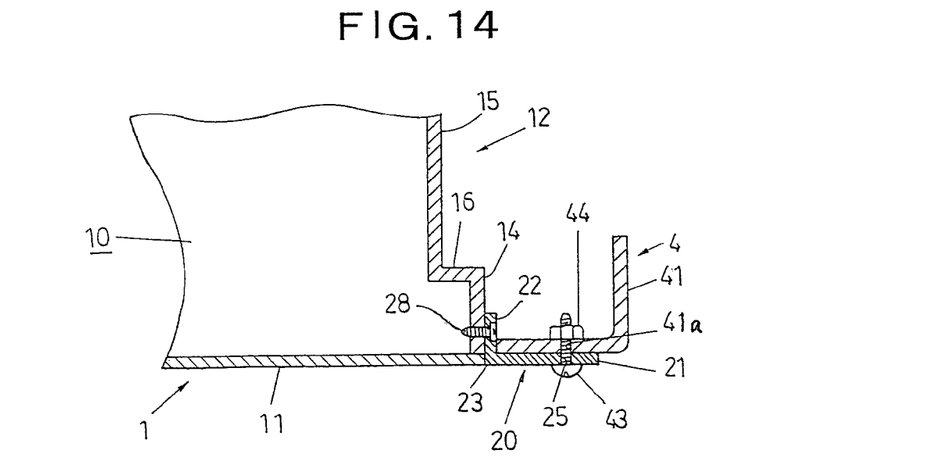
FIG. 14 is an end view showing an enlarged cross section of a fixing portion of the angle member and rack along a line XIV-XIV in FIG. 13 together with a stepped portion of the main body of the mixer.

FIG. 14 is an end view of an enlarged cross section of a fixing portion of the angle member 20 and attachment support 41 along a line XIV-XIV in FIG. 13.

As shown in FIG. 14, by inserting a bolt 43 into the attachment hole 25 for rack-mount and attachment hole 41a in the attachment support 41 of the rack 4 from the front side of the first plate 21 of each of the angle members 20, and screwing and fastening a nut 44 from the rear surface side of the attachment support 41, the angle member 20 can be fixed to the attachment support 41 to thereby easily fix the mixer 1 to the rack 4.

It should be noted that the fixation can be realized without using the nut 44 if the attachment hole 41a in the attachment support 41 of the rack 4 is a female screw hole. However, to absorb a positional error between the attachment hole 25 in the first plate 21 and the attachment hole 41a in the mounting support 41, at least one of the attachment holes 25 and 41a is preferably formed into a hole larger in diameter than the bolt 43 or a long hole.

As described above, by attaching the angle members 20 on both the side faces 12 of the main body 10 in the second attachment mode, the mixer 1 can be mounted on the rack 4 in such a manner that the panel 11 of the main body 10 faces the front side of the rack 4 (is opposed to a user) even if the shape of the main body 10 thereof is not a cube or rectangular solid but an almost dustpan shape or wedge shape. In addition, since the mixer 1 is fixed to the rack 4 at a plurality of points, the mixer 1 can be fixed with reliability and good stability.

Further, in this example, the front surfaces of the first plate 21 of the angle member 20 and the panel 11 of the main body 10 are flush with each other as described above, and therefore when the mixer 1 is mounted on the rack 4, the front surfaces of the attachment support 41 and panel 11 are also flush with each other. Accordingly, the panel 11 never bulges out or is recessed from the front surface of the rack 4, facilitating the user operating the mixer 1.

Further, by selecting a position where to align the attachment holes 25 for rack-mount in the angle members 20 with the attachment holes 41a for attachment of an electronic device in the rack 4, the mixer 1 can be mounted at a position (height) where the user operates it most easily.

In the example of rack mount shown in FIG. 13, all of the angle members 20 are attached to both the side faces 12 of the main bodies 10 in the second attachment mode, in which the lower mixer 1 is in the mounting state shown in FIG. 5, and the upper mixer 1 is in the mounting state shown in FIG. 6. Accordingly, the projection-shaped end portions 21*a* of the first plates 21 of the angle members 20 project from the rear surface 10*b* of the main body 10 in the lower mixer 1, and the projection-shaped end portions 21*a* of the first plates 21 of the angle members 20 project from the front surface 10*a* of the main body 10 in the upper mixer 1.

Therefore, a space 50 having a distance d is formed between the two mixers 1. Note that the space 50 can be eliminated by exchanging the upper and lower mixers 1 with each other for mount, and the distance d of the space 50 (see FIG. 13) becomes almost half by attaching the angle members 20 of the two mixers 1 in the same direction (by bringing both of them into one of the attachment states shown in FIG. 5 and FIG. 6). The distance d of the space 50, however, depends on the positions of the attachment holes 25 in the angle members 20 and the attachment holes 41*a* in the rack 4.

As has been described in the explanation on the prior art, it is typical to install wiring on the rear side of the rack when an electronic device is rack-mounted. However, when an electronic device such as a mixer which is often operated in a dark place is rack-mounted, its cords need to be led from the rear side to the front side of the rack because an external lighting fixture is used on the front side of the rack.

For that situation, in the example shown in FIG. 13, a cord 61 of the lighting fixture 6 can be led through the space 50 between the upper and lower mixers 1. The necessary cord and so on can be led to the front surface side without raising or lowering the position of one of the mixers 1 by one level, which eliminates the necessity to shift the position (height) of the mixer 1 from the position where the user operates it most easily. Further, appropriate use between the attachment states shown in FIG. 5 and FIG. 6 in the second attachment mode enables fine positional adjustment of the upper and lower mixers 1 when they are rack-mounted.

On the other hand, when the mixer 1 is not rack-mounted, it is only required to attach the angle members 20 on both the side faces 12 of the main body 10 in the first attachment mode as shown in FIG. 1, which eliminates the necessity to detach the angle members 20 from the main body 10 and separately store them and the necessity of management efforts and securing of storage space.

In the above-described embodiment, the connecting portion 16 of the stepped portion on the side face 12 of the mixer 1 is shown as a flat surface-shaped wall. The connecting portion 16, however, is not limited to the flat surface but may have projections and depressions. Further, the angle formed between the first wall portion 14 and connecting portion 16 of the stepped portion need not be the almost right angle but may be an obtuse angle or an acute angle. Also in this case, when the angle member 20 is fixed in the first attachment mode, it is desirably formed to have a size and shape to be in contact with the first wall portion 14 and face the connecting portion 16 so as to cover both of them.

Furthermore, the angle formed between the first wall portion 14 of the stepped portion and panel 11 need not be the almost right angle. Accordingly, the angle formed between the first plate 21 and second plate 22 of the angle member 20 need not be the almost right angle but may be an obtuse angle or an acute angle. Each of the widths of the first plate 21 and second plate 22 can be also arbitrarily changed in accordance with the shape of the stepped portion.

In the foregoing, the embodiments when an electronic device to which the invention is applied is a mixer have been described, but the invention is not limited to this. As a matter of course, even when the invention is applied to other electronic devices that are used in stand-alone or rack-mounted, the same effect can be obtained.

Further, in the above-described example of rack-mount, the case has been described in which electronic devices (the mixers in the case shown in FIG. 13) are mounted arranged in the vertical direction on the rack having attachment supports vertical to the floor. The rack-mount is not limited to the above, but the electronic devices can be similarly mounted on a rack having attachment supports inclined to the floor. In this case, the electronic devices are attached in such a manner that their panel surfaces are inclined to the vertical or horizontal direction.

Furthermore, when electronic devices having different lateral width dimensions are mounted on the same rack, it is adoptable to separately prepare a flat plate (adjuster) having two or more adjusting holes and fix the angle members and attachment supports via the adjuster.

Moreover, the invention is not limited to the angle members that are attached to stepped portions provided on right and left side faces of an electronic device, but it is also adoptable to provide stepped portions on the front surface and rear surface being front and rear sides surfaces of an electronic device and attach the angle members thereto so that the electronic device is fixed not to attachment supports but to shelf plates or side angle members in rack-mount. Besides, when stepped portions are provided on three or more side faces of an electronic device, the angle members may be attached to all or some of the stepped portions.

In the above-described embodiments, the cases have been described in which the shape of the angle member is asymmetrical about the center in the longitudinal direction, but the shape is not limited to this. The shape of the angle member can be formed either symmetrical or asymmetrical in accordance with the shape of the stepped portion, and the invention is applicable to both of them. Note that when it is asymmetrical, there is an advantage that the two kinds of attachment states in the second attachment mode can be selected. On the other hand, when it is symmetrical, selectable attachment states are only two kinds because only one kind of attachment state is provided even in the second attachment mode, but there is an advantage that only one kind of angle member is required since the angle members having the same shape are attached to both the sides faces of the main body.

Besides, in the above-described embodiments, the cases have been described in which the attachment holes in the angle member are symmetrical about the center in the longitudinal direction, and the stepped portions on both the side faces of the main body and the angle members are bilaterally symmetrical about the center in the lateral width direction of the main body but, not limited to this, one of the above may be asymmetrical. In this case, however, the attachment state in the second attachment mode is only one.

Further, the shape of the attachment hole in the angle member is not limited to the round hole, but the angle member having even a long hole or a slit can be similarly mounted. Furthermore, the number of attachment holes is not limited to two or four, but can be any number as long as it is plural.

Moreover, the number of screwed points with attaching screws constituting an attachment means, which detachably fixes the angle member to the stepped portion on the side face of the main body, together with the above attachment holes, can be any number as long as it is two or more for one angle member.

Further, the attachment means is not limited to screwing, but other means may be used. For example, it is also adoptable to attach the angle member by providing a reverse wedge-shaped protrusion on the angle member, providing a groove fitting with the protrusion in the first wall portion, and fitting the protrusion with the groove fitting therewith and sliding the angle member in the first wall portion.

In the above-described embodiment, the case has been described in which rack mount is performed such that the panel surface of the electronic device and the front surface of the rack are substantially flush with each other, but rackmount is not limited to this. For example, by performing rack mount with the angle member being attached such that the first plate somewhat bulges out from the panel surface of the main body, the panel surface of the electronic device is somewhat recessed from the front surface of the rack, whereby the controls and indicators provided on the panel can be protected.

As has been described, in the electronic device according to the invention, when its mountain-shaped angle members are mounted on the stepped portions on the sides faces of the main body in the first attachment mode or second attachment mode, whereby when it is used in stand-alone, the angle member can protect the projecting portions of the stepped portions of the main body to prevent its breakage, and when it is used in rack-mounted, fixation thereof to the rack can be easily and reliably performed. In addition, its structure is simple and can be embodied at low cost, and it is unnecessary to store and manage the angle members.

What is claimed is:

1. An electronic device with a side face having a stepped portion to which a mountain-shaped angle member is fixable,
    said stepped portion comprising a first wall portion projecting outward from said side face, a second wall portion recessed inward from said first wall portion, and a connecting portion connecting said second wall portion and first wall portion,
    said electronic device including a fixing member for detachably fixing said angle member to said first wall portion, and
    said fixing member being a member for fixing said angle member in any one of a first attachment mode in which said angle member is in contact with said first wall portion and opposed to said connecting portion and a second attachment mode in which said angle member is in contact with said first wall portion and overhangs outward said first wall portion,
    wherein said angle member comprises a first plate and a second plate joined with each other at a bent portion, and in a cross section perpendicular to an longitudinal direction thereof, a distance from an outer end portion of said first plate to said bent portion is longer than a distance from an outer end portion of said second plate to said bent portion;
    said first plate is provided with a first fixing portion for fixing to said side face;
    said second plate is provided with a second fixing portion for fixing to said side face; and
    a distance from the outer end portion of said first plate to said first fixing portion is equal to a distance from said bent portion to said second fixing portion of the second plate.

2. An electronic device according to claim 1, wherein said side face has a third fixing portion for fixing to said first fixing portion or second fixing portion provided in said angle member.

3. An electronic device according to claim 2, wherein all of said first, second, and third fixing portions are holes into which a penetrating member penetrates.

4. An electronic device according to claim 2, wherein, said third fixing portion is a penetrating member; and said first and second fixing portions are holes into which said penetrating member penetrates.

5. An electronic device according to claim 2, wherein said first and second fixing portions are penetrating members; and said third fixing portion is a hole into which said penetrating member penetrates.

6. An electronic device with a side face having a stepped portion to which a mountain-shaped angle member is fixable,
    said electronic device including a fixing member for detachably fixing said angle member, and
    said fixing member being a member for fixing said angle member in a first attachment mode in which said angle member covers the stepped portion and a second attachment mode in which said angle member overhangs outward said side face,
    wherein said angle member comprises a first plate and a second plate joined with each other at a bent portion, and in a cross section perpendicular to an longitudinal direction thereof, a distance from an outer end portion of said first plate to said bent portion is longer than a distance from an outer end portion of said second plate to said bent portion;
    said first plate is provided with a first fixing portion for fixing to said side face of the electronic device;
    said second plate is provided with a second fixing portion for fixing to said side face; and
    a distance from the outer end portion of said first plate to said first fixing portion is equal to a distance from said bent portion to said second fixing portion of the second plate.

7. An electronic device with a side face having a stepped portion to which an angle member is fixable,
    said stepped portion comprising a first wall portion projecting outward from said side face, a second wall portion recessed inward from said first wall portion, and a connecting portion connecting said second wall portion and first wall portion,
    said electronic device including a fixing member for detachably fixing said angle member to said first wall portion, said angle member including a first set of one or more attachment holes and a second set of one or more attachment holes, and
    said fixing member being a member for fixing said angle member through said first set of one or more attachment holes in a first attachment mode and through said second set of one or more attachment holes in a second attachment mode,
    wherein said angle member comprises a first plate and a second plate joined with each other at a bent portion, and in a cross section perpendicular to a longitudinal direction thereof, a distance from an outer end portion of said first plate to said bent portion is longer than a distance from an outer end portion of said second plate to said bent portion,
    said first plate is provided with said first set of one or more attachment holes for fixing to said side face;
    said second plate is provided with said second set of one or more attachment holes for fixing to said side face; and
    a distance from the outer end portion of said first plate to said first set of one or more attachment holes of said first plate is equal to a distance from said bent portion to said second set of one or more attachment holes of the second plate.

* * * * *